(12) United States Patent
Alshammari et al.

(10) Patent No.: US 10,964,822 B2
(45) Date of Patent: Mar. 30, 2021

(54) SINGLE MATERIAL ELECTRONIC DEVICE AND METHOD OF PRODUCING SUCH AN ELECTRONIC DEVICE

(71) Applicant: KING ABDULLAH UNIVERSITY OF SCIENCE AND TECHNOLOGY, Thuwal (SA)

(72) Inventors: Fwzah Hamud Alshammari, Thuwal (SA); Husam Niman Alshareef, Garland, TX (US)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 16/624,151

(22) PCT Filed: Jun. 15, 2018

(86) PCT No.: PCT/IB2018/054438
§ 371 (c)(1),
(2) Date: Dec. 18, 2019

(87) PCT Pub. No.: WO2019/016627
PCT Pub. Date: Jan. 24, 2019

(65) Prior Publication Data
US 2020/0176605 A1    Jun. 4, 2020

Related U.S. Application Data

(60) Provisional application No. 62/533,727, filed on Jul. 18, 2017.

(51) Int. Cl.
*H01L 29/786* (2006.01)
*H01L 29/49* (2006.01)
(Continued)

(52) U.S. Cl.
CPC ...... *H01L 29/7869* (2013.01); *H01L 29/4966* (2013.01); *H01L 29/517* (2013.01); *H01L 29/66969* (2013.01)

(58) Field of Classification Search
CPC ............. H01L 29/7869; H01L 29/4966; H01L 29/517; H01L 29/66969
(Continued)

(56) References Cited

U.S. PATENT DOCUMENTS

2007/0049051 A1    3/2007   Ahn et al.
2013/0256654 A1   10/2013   Park et al.
2014/0035456 A1*   2/2014   Isa ...................... H01L 51/5253
                                                                313/498

FOREIGN PATENT DOCUMENTS

EP      1134811 A1      9/2001
JP      2002076356 A    3/2002

OTHER PUBLICATIONS

Ahn, C.H., et al., "Tunable Electrical and Optical Properties in Composition Controlled Hf:ZnO Thin Films Grown by Atomic Layer Deposition," Journal of the Electrochemical Society, vol. 159, No. 4, Jan. 23, 2012, pp. H384-H387 (5 pages total).
(Continued)

*Primary Examiner* — Tong-Ho Kim
(74) *Attorney, Agent, or Firm* — Patent Portfolio Builders PLLC

(57) ABSTRACT

A semiconductor device includes a substrate, a gate arranged on the substrate, a dielectric arranged on the gate, a channel arranged on the dielectric, a source electrically coupled to the channel, and a drain electrically coupled to the channel. Each of the gate, dielectric, channel, source, and drain includes a corresponding mixture of hafnium dioxide (HfCte) and zinc oxide (ZnO) layers and at least two of the
(Continued)

gate, dielectric, channel, source, and drain comprise different mixtures of the hafnium dioxide and zinc oxide layers.

20 Claims, 11 Drawing Sheets

(51) Int. Cl.
*H01L 29/51* (2006.01)
*H01L 29/66* (2006.01)

(58) Field of Classification Search
USPC .......................................................... 257/43
See application file for complete search history.

(56) References Cited

OTHER PUBLICATIONS

Cornelius, S., et al., "Achieving high free electron mobility in ZnO:Al thin films grown by reactive pulsed magnetron sputtering," Applied Physics Letters, vol. 94, 042103, 2009 (Published Online Jan. 26, 2009), pp. 042103-1-042103-3 (4 pages total).

Geng, Y., et al., "Structural, optical, and electrical properties of Hf-doped ZnO films deposited by atomic layer deposition," Surface & Coatings Technology, vol. 232, 2013 (Available online Apr. 29, 2013), pp. 41-45.

Ilican, S., et al., "Polycrystalline indium-doped ZnO thin films: preparation and characterization," Journal of Optoelectronics and Advanced Materials, vol. 10, No. 10, Oct. 2008, pp. 2592-2598.

Nomoto, J., et al., "Comparative study of resistivity characteristics between transparent conducting AZO and GZO thin films for use at high temperatures," Thin Solid Films, vol. 518, 2010 (Available online Oct. 28, 2009), pp. 2937-2940.

Yaglioglu, B., et al., "High-mobility amorphous $In_2O_3$—10 wt % ZnO thin film transistors," Applied Physics Letters, vol. 89, 062103, 2006 (Published Online Aug. 7, 2006), pp. 062103-1-062103-3 (4 pages total).

International Search Report in International Application No. PCT/IB2018/054438, dated Oct. 24, 2018.

Kim, W.-S. et al., "Improvement in the Bias Stability of Tin Oxide Thin-Film Transistors by Hafnium Doping," Thin Solid Films, Aug. 9, 2011, vol. 520, No. 6, pp. 2220-2223, Elsevier.

Written Opinion of the International Searching Authority in International Application No. PCT/IB2018/054438, dated Oct. 24, 2018.

Ding, Xingwei et al., "The Influence of Hafnium Doping on Density of States in Zinc Oxide Thin-Film Transistors Deposited via Atomic Layer Deposition." Nanoscale Research letters, Nano Express, Jan. 23, 2017, pp. 1-7.

* cited by examiner

# SINGLE MATERIAL ELECTRONIC DEVICE AND METHOD OF PRODUCING SUCH AN ELECTRONIC DEVICE

CROSS-REFERENCE TO RELATED APPLICATIONS

This application is a U.S. National Stage Application of International Application No. PCT/IB2018/054438, filed on Jun. 15, 2018, which claims priority to U.S. Provisional Patent Application No. 62/533,727, filed on Jul. 18, 2017, entitled "Single Material Electronic Device and Method of Producing Such an Electronic Device," the disclosures of which are incorporated herein by reference in their entirety.

BACKGROUND

Technical Field

Embodiments of the subject matter disclosed herein generally relate to electronic devices comprising a single material and methods of producing such an electronic device.

Discussion of the Background

Active and passive electronic devices are typically composed of a number of different materials, each serving a specific function for the operation of the electronic device. For example, capacitors, which are passive electronic devices, typically comprise one material for the plates and a different material for the dielectric arranged between the plates. Similarly, thin-film-transistors (TFTs), which are active electronic devices, typically employ a first material for the channel (e.g., zinc oxide (ZnO) or amorphous silicon), a second material for the source and drain contacts (e.g., titanium/gold (Ti/Au)), a third material for the gate (e.g., indium tin oxide (ITO)), and a fourth material for the insulator/dielectric interposed between the gate and the channel.

These different materials typically require different deposition techniques, and accordingly, producing an electronic device from these different materials typically requires the use of a number of different reaction chambers, which is particularly true for active electronic devices. This increases the time to produce the electronic device, as well as the cost for such production.

Selecting the materials used to produce electronic devices typically involves a trade-off between material performance and material cost. For example, although indium tin oxide has been found to be a very good material for forming the contact material of a transistor, the available supplies of indium are dwindling. Accordingly, the cost of this material, and in turn the resulting cost of an electronic device produced using this material, continue to increase.

In certain applications, such as solar cells, it is desirable for as much of the electronic device to be transparent. However, solar cells typically have Al source and drain contacts that are not transparent. In certain applications, such as solar cells, this can affect the overall efficiency of device.

In certain applications using thin-film-transistors (TFTs), it is desirable for much of the electronic device to be transparent. However, TFTs typically have Ti/Au source and drain contacts that are not transparent, which can affect operation of the TFT in certain applications.

Accordingly, there is a need for methods of producing electronic devices that reduce production time and cost, as well as electronic devices produced using such methods.

SUMMARY

According to an embodiment, there is a semiconductor device, which includes a substrate, a gate arranged on the substrate, a dielectric arranged on the gate, a channel arranged on the dielectric, a source electrically coupled to the channel, and a drain electrically coupled to the channel. Each of the gate, dielectric, channel, source, and drain includes a corresponding mixture of hafnium dioxide ($HfO_2$) and zinc oxide (ZnO) layers and at least two of the gate, dielectric, channel, source, and drain comprise different mixtures of the hafnium dioxide and zinc oxide layers.

According to another embodiment, there is method for producing a semiconductor device, the method involves forming a gate on a substrate, forming a dielectric on the gate, forming a channel on the dielectric, and forming a source and drain on the dielectric. The source and drain are electrically coupled to the channel. Each of the gate, dielectric, channel, source, and drain are formed of a corresponding mixture of hafnium dioxide ($HfO_2$) and zinc oxide (ZnO) layers and at least two of the gate, dielectric, channel, source, and drain are formed using different mixtures of the hafnium dioxide and zinc oxide layers.

According to a further embodiment, there is an electronic device, which includes a first electrical compounded layer including a first set of layers of hafnium dioxide ($HfO_2$) and zinc oxide (ZnO) layers, and a second electrical compounded layer coupled to the first electrical compounded layer and including a second set of layers of hafnium dioxide and zinc oxide. A number of layers of hafnium oxide and zinc oxide is different for the first and second set of layers.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of active and passive electronic devices.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

According to an embodiment an electronic device includes a first electrical compounded layer comprising a first set of layers of hafnium dioxide and zinc oxide layers, and a second electrical compounded layer coupled to the first electrical compounded layer and comprising a second set of layers of hafnium dioxide and zinc oxide layers. A number of layers of hafnium dioxide and zinc oxide is different for the first and second compounded layers.

Figure 1A:
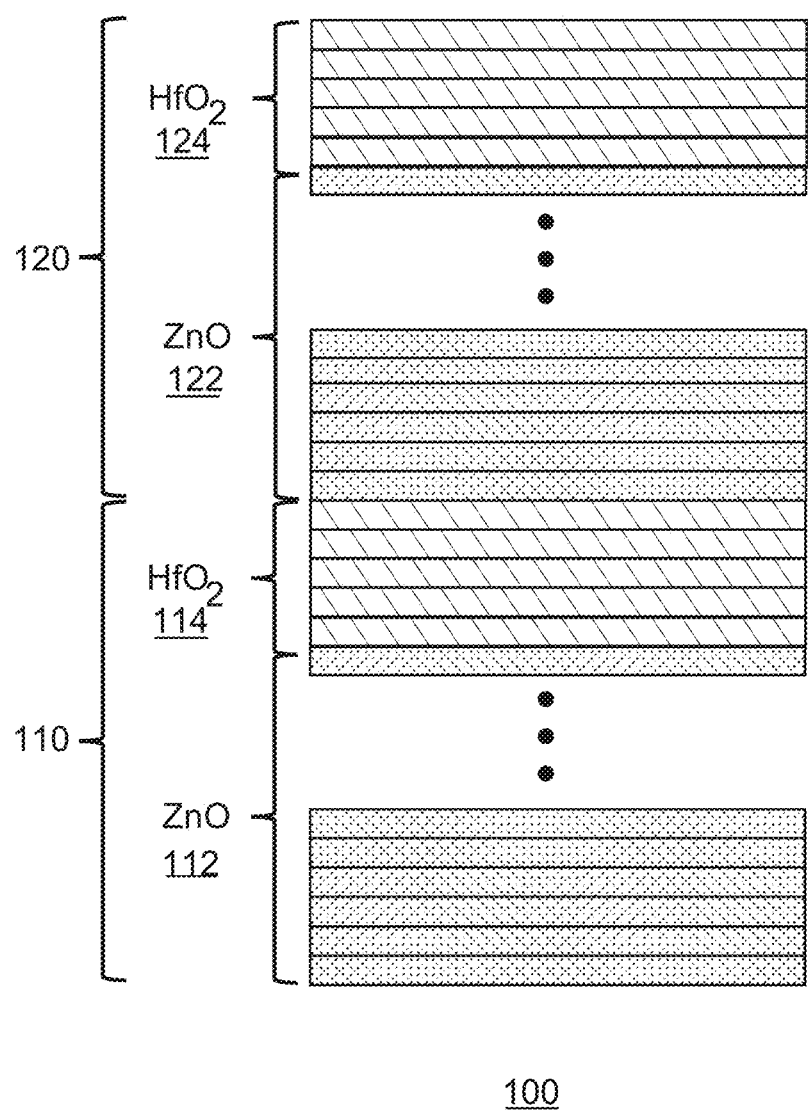
FIG. 1A is a schematic diagram of an electronic device according to an embodiment.
Figure 1B:
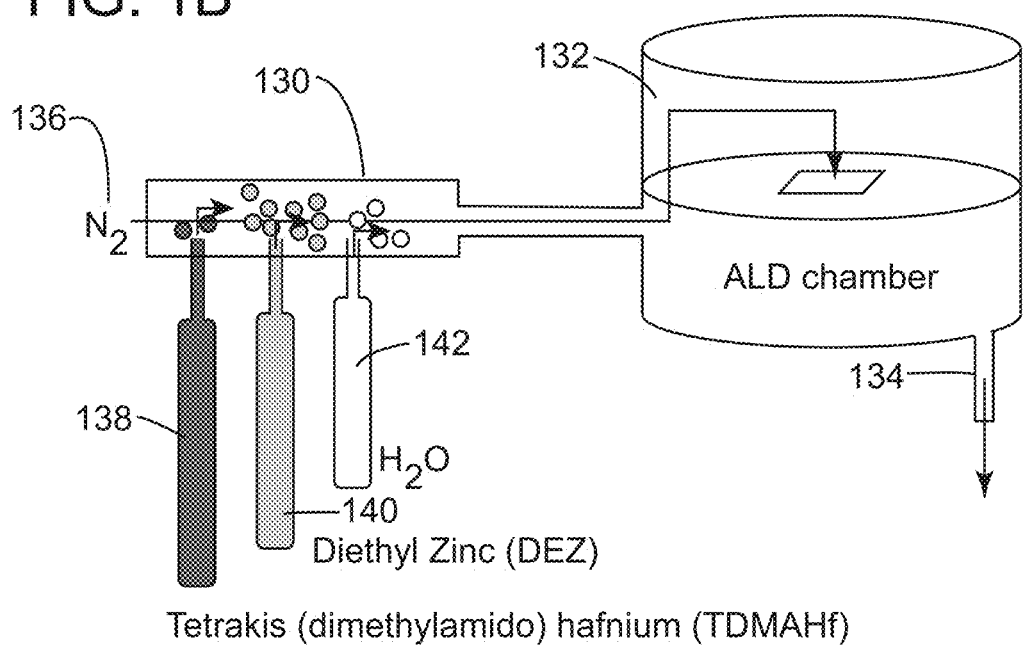
FIGS. 1B-1E are schematic diagrams of a method for producing electrical layers according to an embodiment.
Figure 1C:
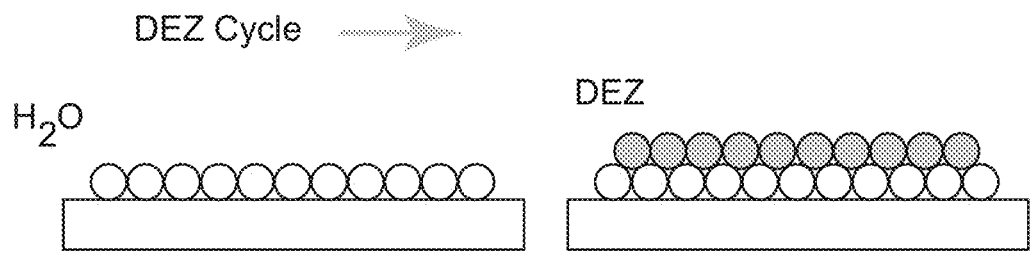

FIG. 1A is a schematic diagram of device according to an embodiment. The electrically active portions of the illustrated electronic device, as well as the other disclosed electronic devices, are made of a single material, which in this case is a mixture of at least one hafnium oxide ($HfO_2$) layer and at least one zinc oxide (ZnO) layer. The mixture of these two layers is being referred to herein as a compounded layer. The material made from these two layers can be referred to as an HZO material. Thus, a HZO material may include "n" layers of $HfO_2$ and "m" layers of ZnO. By selecting appropriate values for the values of n and m (which are positive integers), it is possible, as discussed later, to change the electrical properties of the compounded layer so that for a certain combination of n and m, the compounded layer is a dielectric, for another combination of n and m, the compounded layer is a semiconductor, and for still another combination of n and m, the compounded layer is a conductor. The electrical characteristics (i.e., conducting, insulating, semiconducting) of a compounded layer made from this single material can be adjusted by changing the flow rate of the hafnium and zinc chemical precursors used to form the particular compounded layer. Thus, as will be described in more detail below, a semiconducting compounded layer will have a first mixture of hafnium oxide and zinc oxide layers, a conducting compounded layer will have a second mixture of these layers, and a dielectric compounded layer will have a third mixture of these layers. The use of a mixture of hafnium oxide and zinc oxide layers to produce all of the electrically active portions of an electronic device is particularly advantageous because testing has demonstrated that such a device is substantially transparent; specifically testing demonstrated such electronic devices were more than 90% transparent in the visible electromagnetic spectrum range.

As discussed above, all of the electrically active portions are made from the single material. The non-electrically active portions, such as the substrate, can be made of other materials, such as glass. Alternatively, the substrate can be formed using single crystal insulating hafnium oxide as the substrate, however, this is more expensive than using a glass substrate.

The electronic device 100 in this example is a diode, which includes a first electrical compounded layer 110 adjoining a second electrical compounded layer 120, each comprising a set of layers of a first and second compound, which in the illustrated example are hafnium oxide and zinc oxide. The first compounded layer 110 includes a set of layers including a plurality of layers 114 of hafnium oxide arranged on top of a plurality of layers 112 of zinc oxide. Similarly, the second compounded layer 120 includes a set of layers including a plurality of layers 124 of hafnium oxide arranged on top of a plurality of layers 122 of zinc oxide. This arrangement forms a Schottky diode from an HZO/HZO heterojunction because all of the HZO semiconducting layers are n-type.

The electronic device illustrated in FIG. 1A, as well as the other disclosed electronic devices, are produced by flowing two different gasses sequentially to create layers having different electrical characteristics. Specifically, referring to FIGS. 1B-1E, the layers are produced by providing gasses from a gas box 130 into an atomic layer deposition (ALD) reaction chamber 132 and excess gasses are removed by a pump (not illustrated) via outlet 134. All layers are formed while nitrogen gas $N_2$ 136 is fed into gas box 130. It will be recognized that there are a number of variants of ALD, such as plasma-enhanced ALD, and any of these variants can be used with the present invention.

Tetrakis (dimethylamido) hafnium (TDMAHf) from tank 138, diethyl zinc (DEZ) from tank 140, or water $H_2O$ from tank 142 is mixed with the nitrogen gas in gas box 130 and feed into the reaction chamber 132 to form one of the layers of the set of layers forming the electronic device. Tetrakis (dimethylamido) hafnium (TDMAHf) and diethyl zinc (DEZ) are two examples of precursors that can be used to make hafnium oxide and zinc oxide, and accordingly other precursors can be used with the present invention.

Figure 1D:
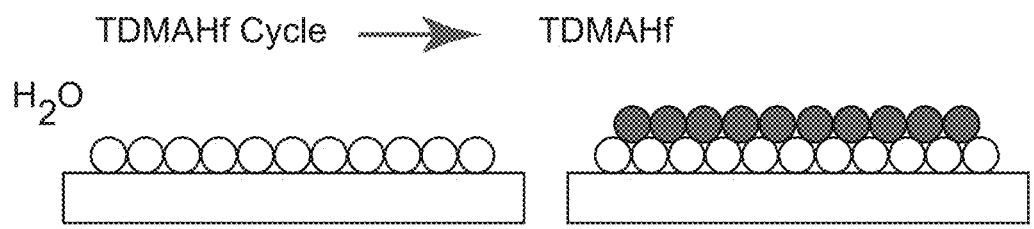
Figure 1E:
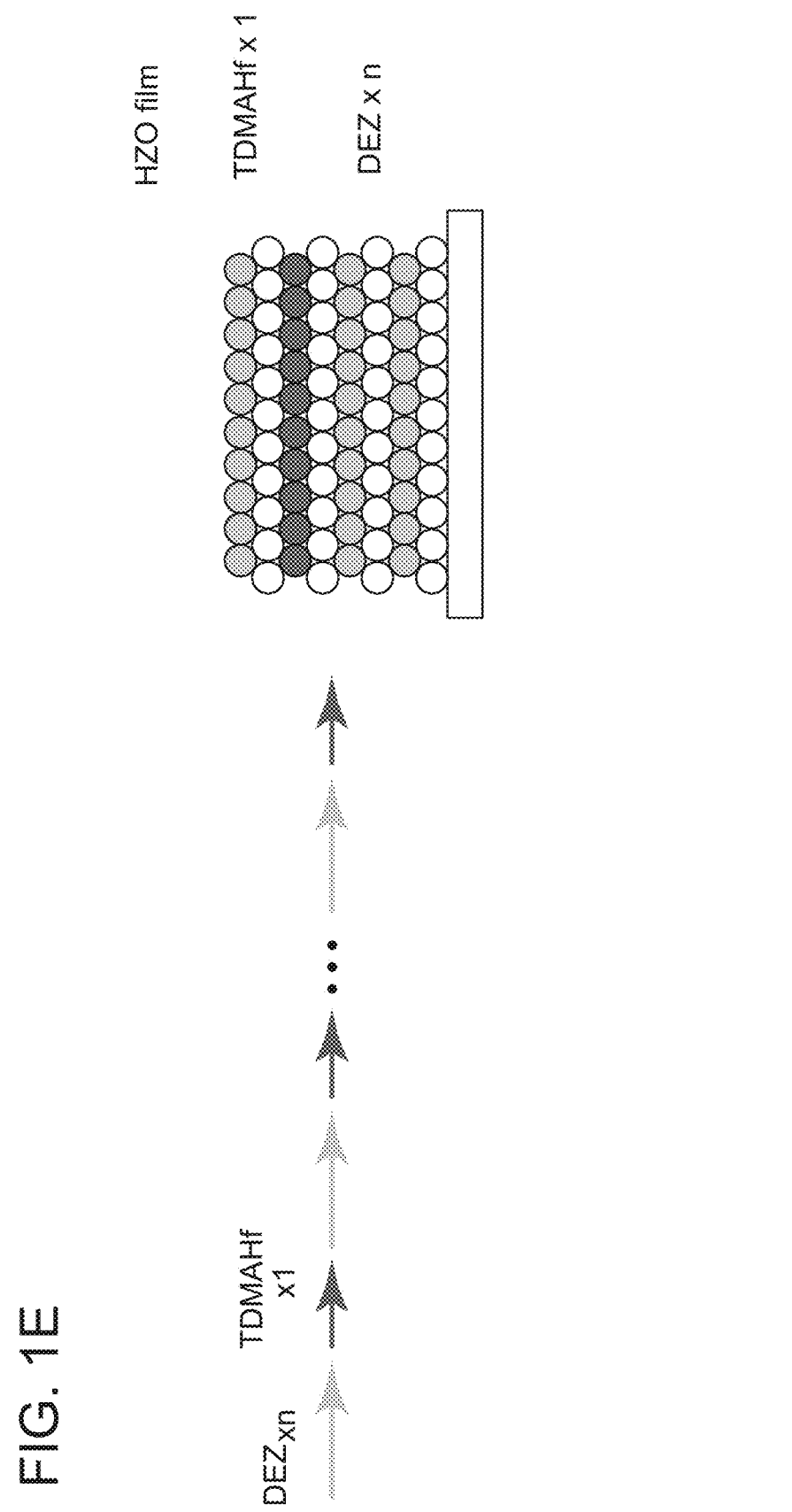

As illustrated in FIG. 10, forming a zinc oxide layer involves first feeding water from tank 142, which is mixed with nitrogen 136 in gas box 130, into reaction chamber 132, followed by feeding diethyl zinc, which is mixed with nitrogen in gas box 130, into reaction chamber 132. As illustrated in FIG. 1D, forming a hafnium oxide layer involves first feeding water from tank 142, which is mixed with nitrogen 136 in gas box 130, into reaction chamber 132, followed by feeding tetrakis (dimethylamido) hafnium, which is mixed with nitrogen in gas box 130, into reaction chamber 132. Finally, as illustrated in FIG. 1E, a compounded layer of an electronic device is formed by sequentially feeding water and tetrakis (dimethylamido) hafnium or water and diethyl zinc into the reaction chamber 132, which in the example illustrated in FIG. 1E involves n deposition cycles of water and diethyl zinc and one deposition cycle of water and tetrakis (dimethylamido) hafnium. By changing the number and order of deposition cycles of water and diethyl zinc and of water and tetrakis (dimethylamido) hafnium, the electrical characteristics of the compounded layer can be controlled. Further, this allows the formation of all electrically active portions of the electronic device to be formed in a single reaction chamber.

The process illustrated in FIGS. 1B-1E produces an HZO film. However, the process can also be used to produce an AZO film by replacing the tetrakis (dimethylamido) hafnium precursor with trimethyl aluminum, in which case an aluminum oxide ($Al_2O_3$) layer is formed instead of a hafnium oxide layer. Accordingly, the disclosures herein apply equally to devices produced using HZO or AZO film.

Figure 2A:
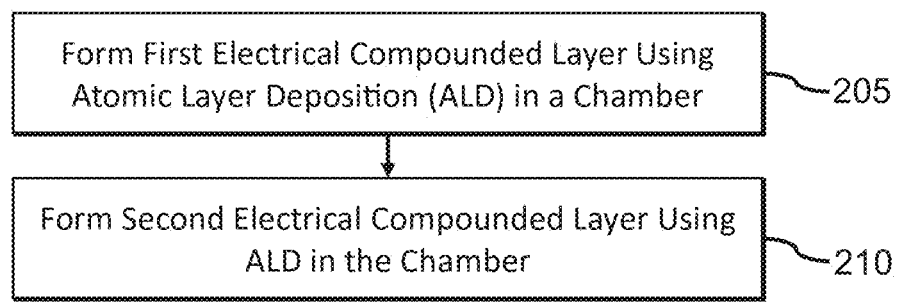
FIG. 2A is flow chart of a method for producing an electronic device according to an embodiment.
Figure 2B:
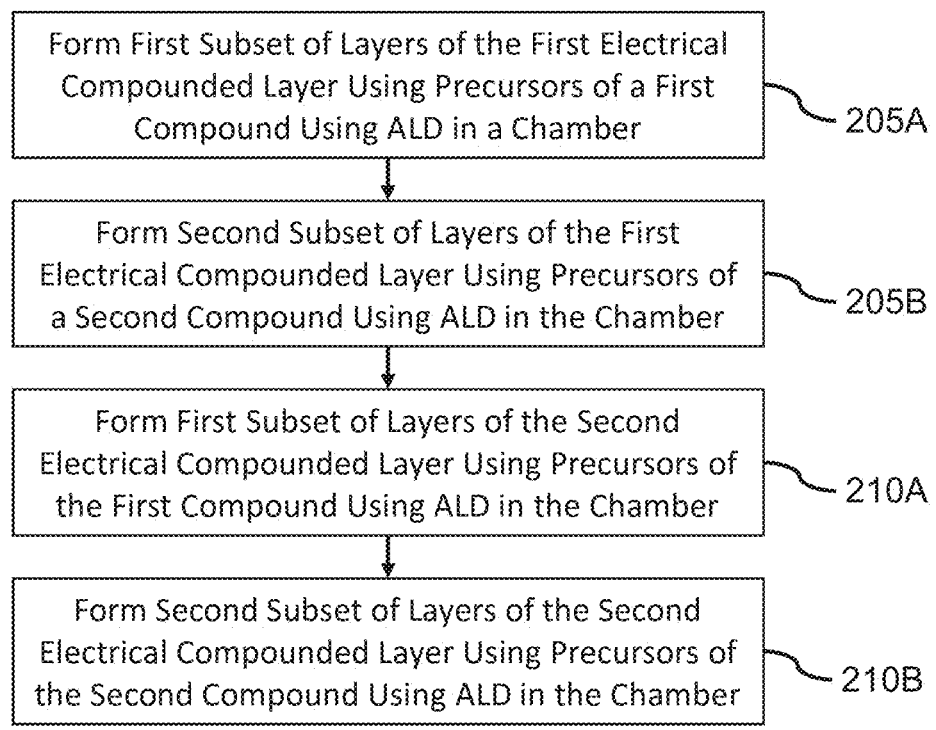
FIG. 2B is a flow chart providing more details of the method for producing an electronic device of FIG. 2A according to an embodiment.

FIGS. 2A and 2B are flow charts of a method of producing an electronic device, such as the one illustrated in FIG. 1A. Referring first to FIG. 2A, the first electrical compounded layer 110 is formed using atomic layer deposition in a reaction chamber (step 205) and then the second electrical compounded layer 120 is formed on the first electrical compounded layer 110 by atomic layer deposition in the same reaction chamber (step 210).

Turning now to FIG. 2B, which is a more detailed flow chart of the method illustrated by the flow chart of FIG. 2A, first and second sets of layers of the first and second compounded layers are formed by atomic layer deposition in a single reaction chamber. Specifically, a first subset of layers 112 of the set of layers forming the first compounded layer 110 is formed by atomic layer deposition using precursors of a first compound in a reaction chamber (step 205A) and then a second subset of layers 114 of the set of layers forming the first compounded layer 110 is formed on top of the first subset of layers 112 by atomic layer deposition using precursors of a second compound in the same reaction chamber (step 205B). In the case of the zinc oxide layers, diethyl zinc can be used as a precursor and in the case of the hafnium oxide layers, tetrakis (dimethylamido) hafnium (IV) can be used as a precursor.

Similarly, a first subset of layers 122 of the set of layers forming the second compounded layer 120 is formed by atomic layer deposition using precursors of a first compound in the reaction chamber (step 210A) and then a second subset of layers 124 of the set of layers forming the second compounded layer 120 is formed on top of the first subset of layers 122 by atomic layer deposition using precursors of a second compound in the same reaction chamber (step 210B). Each layer of zinc oxide and hafnium oxide is formed in a single atomic layer deposition cycle.

Figure 3A:
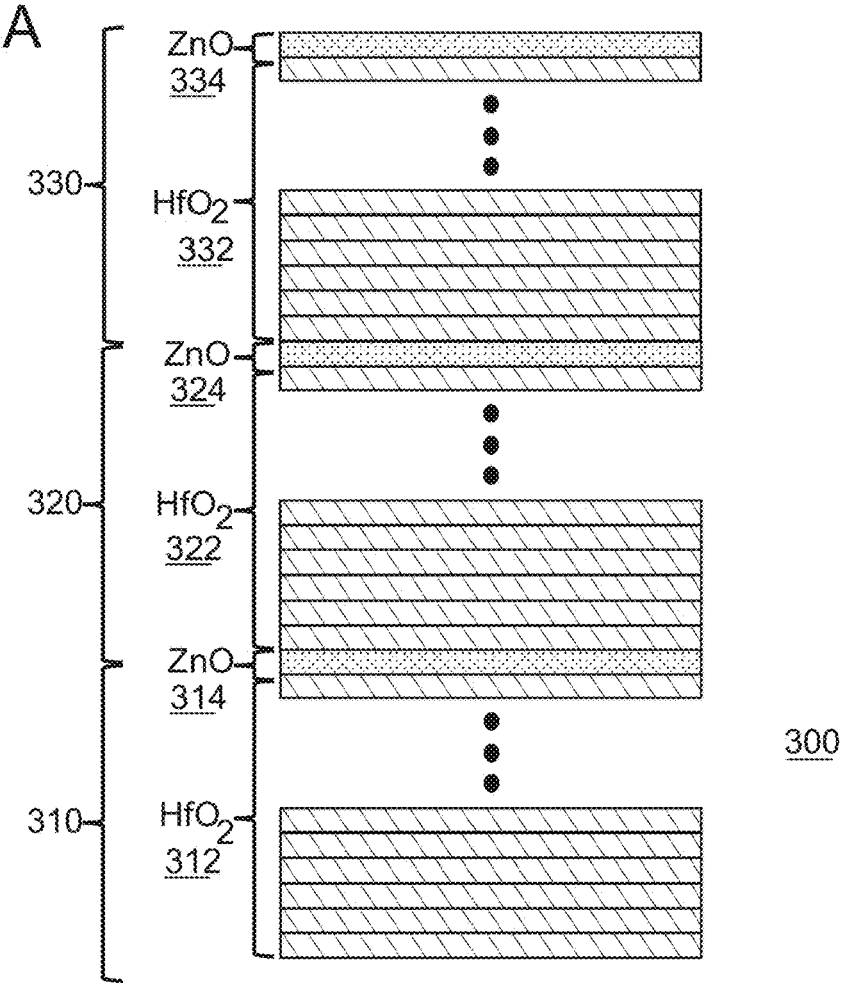
FIG. 3A is a schematic diagram of an electronic device according to an embodiment.

FIG. 3A is a schematic diagram of an electronic device according to an embodiment, which in this example is a capacitor 300. The capacitor 300 includes a dielectric layer 320 interposed between a first plate 310 and a second plate 330. The first plate 310, second plate 330, and dielectric layer 320 are each compounded layers. Specifically, the first plate 310 includes a subset of layers of zinc oxide 314 on top of a subset of layers of hafnium oxide 312, the dielectric layer 320 includes a subset of layers zinc oxide 324 on top of a subset of layers of hafnium oxide, and the second plate 330 includes a subset of layers of zinc oxide 334 on top of a subset of layers of hafnium oxide 332. Although the number of layers of zinc oxide and hafnium oxide for each layer can vary, in one example the first plate 310 and the second plate 330 can include thirty-two layers of hafnium oxide and one layer of zinc oxide, and the dielectric layer 320 can include nineteen layers of hafnium oxide and one layer of zinc oxide.

Figure 3B:
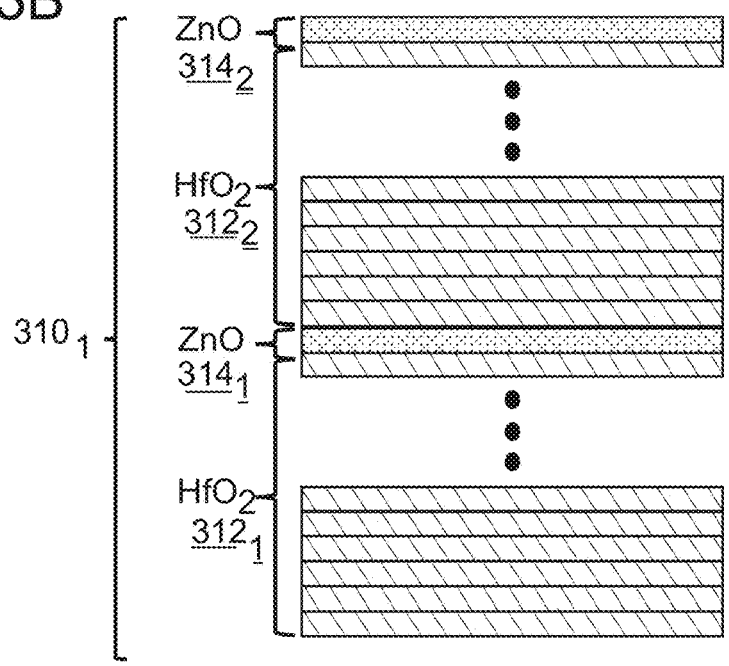
FIG. 3B is a schematic diagram of sets of layers of material of a plate of the electronic device of FIG. 3A according to an embodiment.

In this embodiment and the other disclosed embodiments, the total number of layers of hafnium oxide and zinc oxide depends upon the desired final thickness; however, the ratio of the hafnium oxide layers to the zinc oxide layers define the electrical characteristics of the compounded layers. An example of this is illustrated in FIG. 3B in connection with the plate $310_1$, which is also applicable to plate 330. A thicker plate $310_1$ is obtained by having sixty-four layers of hafnium oxide and two layers of zinc oxide. Specifically, as illustrated in FIG. 3B, a first layer of zinc oxide $314_1$ is interposed between a first set of thirty-two layers of hafnium oxide $312_1$ and a second set of thirty-two layers of hafnium oxide $312_2$ with a second layer of zinc oxide $314_2$ on top of the second set of thirty-two layers of hafnium oxide $312_2$. Similar to the other embodiments disclosed, this arrangement is formed using sequential atomic layer deposition cycles using the identified compounds starting with the bottom layer up to the top layer.

Figure 4A:
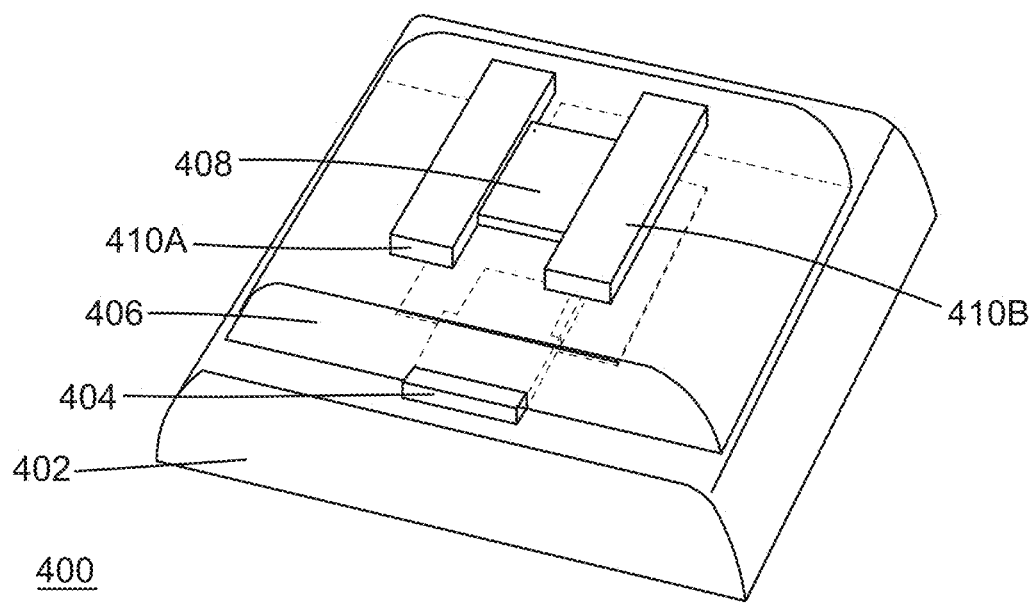
FIGS. 4A and 4B are respectively a perspective view and schematic diagram of an electronic device according to an embodiment.
Figure 4B:
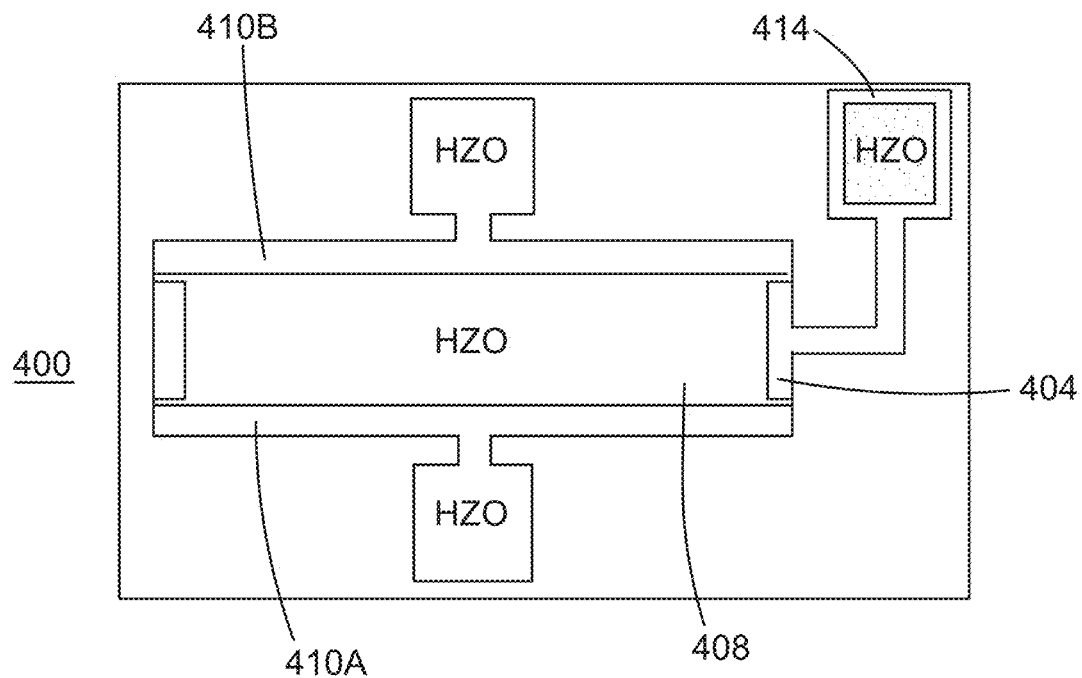

FIGS. 4A and 4B are respectively a perspective view and schematic diagram of an electronic device according to an embodiment. The illustrated electronic device is a thin-film-transistor 400. The thin-film-transistor 400 includes a glass substrate 402 upon which a gate 404, comprising a mixture of zinc oxide and hafnium oxide layers, is arranged. The gate 404 can comprise, for example, fifteen layers of zinc oxide on top of one layer of hafnium oxide. A dielectric layer 406 is arranged on top of the glass substrate 402 and the gate 404. The dielectric layer 406 can comprise, for example, one layer of zinc oxide on top of nineteen layers of hafnium oxide.

A channel 408 is arranged on top of the dielectric layer 406. Beginning with the bottom of the channel 408, the channel 408 can include fifty-four layers of zinc oxide, five layers of hafnium oxide, fifty-three layers of zinc oxide, five layers of hafnium oxide, fifty-three layers of zinc oxide, and five layers of hafnium oxide.

Source and drain contacts 410A and 410B are arranged on top of the dielectric 406 in a manner so that the source and drain contacts 410A and 410B are electrically coupled to and sandwich the channel 408. As illustrated in FIG. 4B, the gate 404 is coupled to a gate contact 414.

Figure 5:
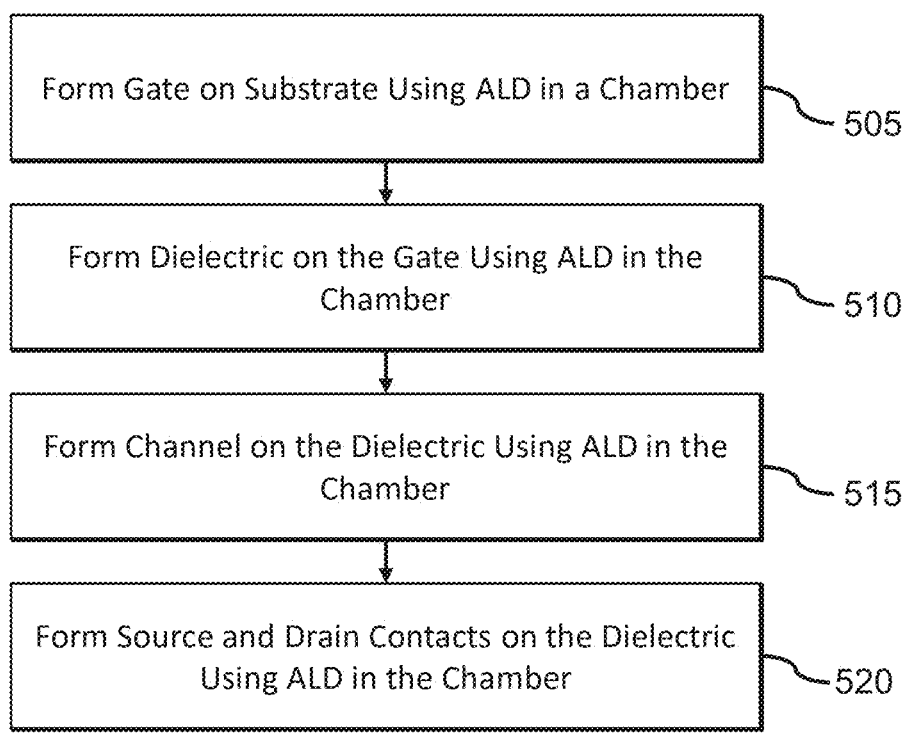
FIG. 5 is a flow chart of a method for producing the electronic device of FIGS. 4A and 4B according to an embodiment.

A method for producing the electronic device illustrated in FIGS. 4A and 4B will now be described in connection with the flow chart illustrated in FIG. 5. Consistent with the discussion above, each forming step involves atomic layer deposition of a set of layers of first and second compounds. Initially, the gate 404 is formed on the glass substrate 402 using atomic layer deposition in a reaction chamber (step 505). This forming step also involves patterning the gate 404 to form the geometry illustrated in FIG. 4A, which can be performed, for example, by etching.

The dielectric 406 is then formed on top of the glass substrate 402 and the gate 404 using atomic layer deposition in the chamber (step 510). Next, the channel 408 is formed on the dielectric 406 using atomic layer deposition in the chamber (step 515). This step also includes patterning of the channel 408 to form the geometry illustrated in FIG. 4A, which can be performed, for example, by etching. The source and drain contacts 410A and 410B are then formed on the dielectric 406 using atomic layer deposition in the chamber (step 520), which also involves patterning to achieve the illustrated geometry.

Testing demonstrated that a thin-film-transistor in which all electrically active portions are made from different mixtures of hafnium oxide and zinc oxide layers, such as the one illustrated in FIGS. 4A and 4B, showed excellent output characteristics with high drain current (>270 μA) and perfect saturation behavior. Transfer curves were measured in the forward and backward sweep modes at a fixed drain to source voltage (VDS) of 10 V and 1V, which resulted in saturation mobility ($\mu_{sat}$) in the saturation range and as high as 16 cm$^2$/Vs with very high $I_{on/off}$ ratio of ~10$^9$ and a low turn-on voltage ($V_{ON}$) of about 1.4 V. Further, the thin-film-transistors showed a low SS value of about 480 mV/dec and a very low gate leakage current ($I_G$) less than 10-12 A.

A number of different thin-film-transistors having different channel width-to-length (W/L) ratios were evaluated. Testing demonstrated no significant change in the saturation mobility values ($\mu_{sat}$) as a function of the channel width-to-length (W/L) ratio.

The stability of a number of different thin-film-transistors was evaluated by applying a constant positive bias stress (PBS) of +10 V and negative bias stress (NBS) of −10 V to the gate electrode of the thin-film-transistor. Testing showed a maximum $V_{th}$ shift of 0.25 and −0.14 V after applying the positive bias stress and negative bias stress for 3,000 secs, respectively, which demonstrates that these thin-film-transistors have excellent electrical stability under constant bias stressing.

Figure 6:
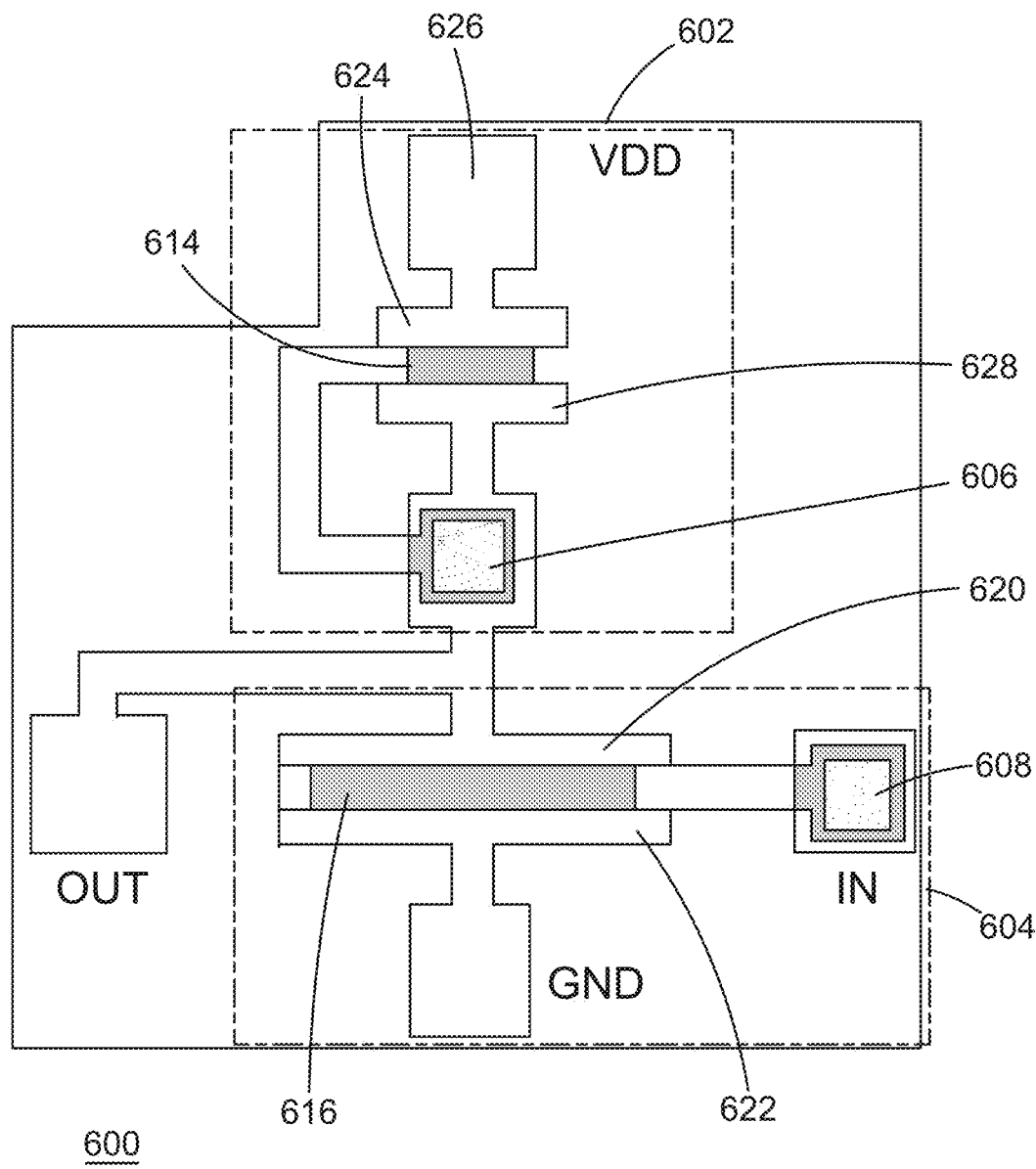
FIG. 6 is a schematic diagram of an electronic device according to an embodiment.

FIG. 6 is a schematic diagram of an electronic device according to another embodiment. The electronic device in this embodiment is an NMOS inverter comprised of two thin-film-transistors. Specifically, the electronic device 600 includes a load transistor 602 coupled to a drive transistor 604. The gate contact 606 of the load transistor 602 is coupled to the source 620 of the drive transistor 604. Contact 608 is a via connected to gate (not illustrated) of the drive transistor 604, the source 620 of the drive transistor 604 is coupled to the inverter output (OUT), and the drain 622 of the drive transistor 604 is coupled to ground (GND). The source 624 of the load transistor 602 is coupled to the supply voltage (VDD) via contact 626 and the drain 628 of the load transistor 602 is coupled to the gate contact 606. Also illustrated are the channel 614 of the load transistor 602 and the channel 616 of the drive transistor 604. It will be recognized that additional transistors can be coupled to obtain other types of electronic devices.

Figure 7A:
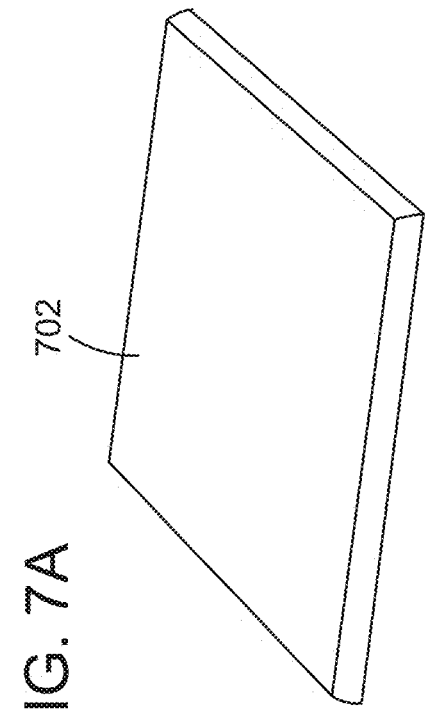
FIGS. 7A-7H are perspective views of the production of the electronic device of FIG. 6 according to an embodiment.
Figure 7B:
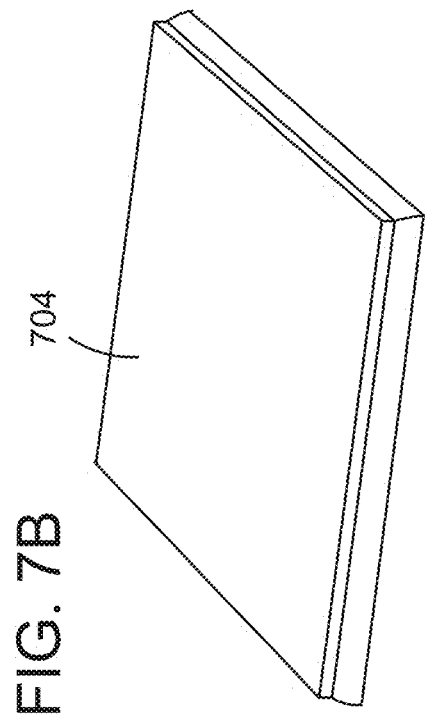
Figure 7C:
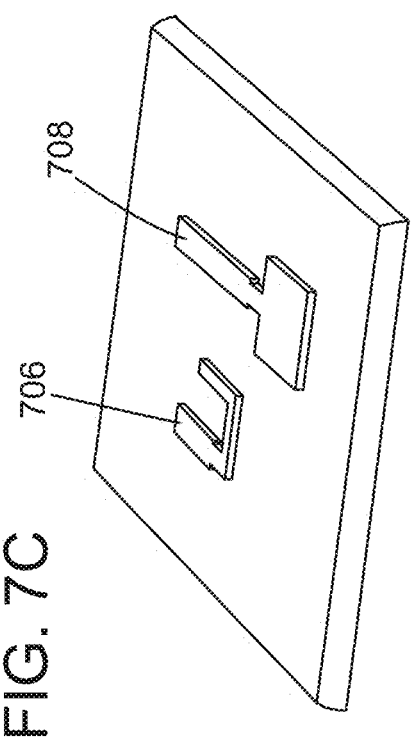
Figure 7D:
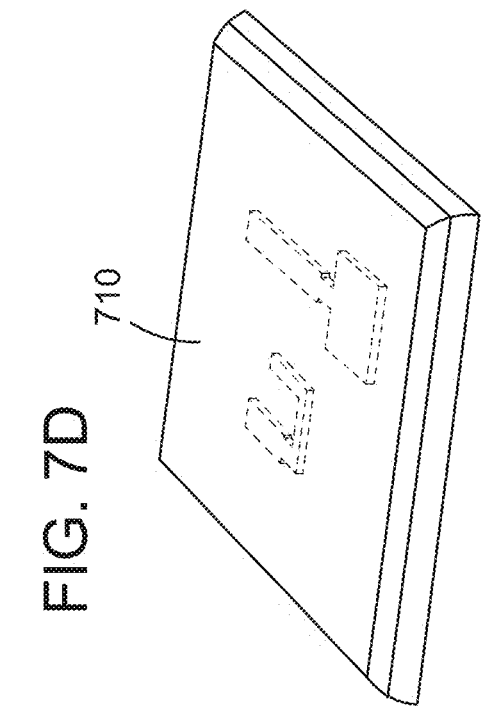
Figure 7E:
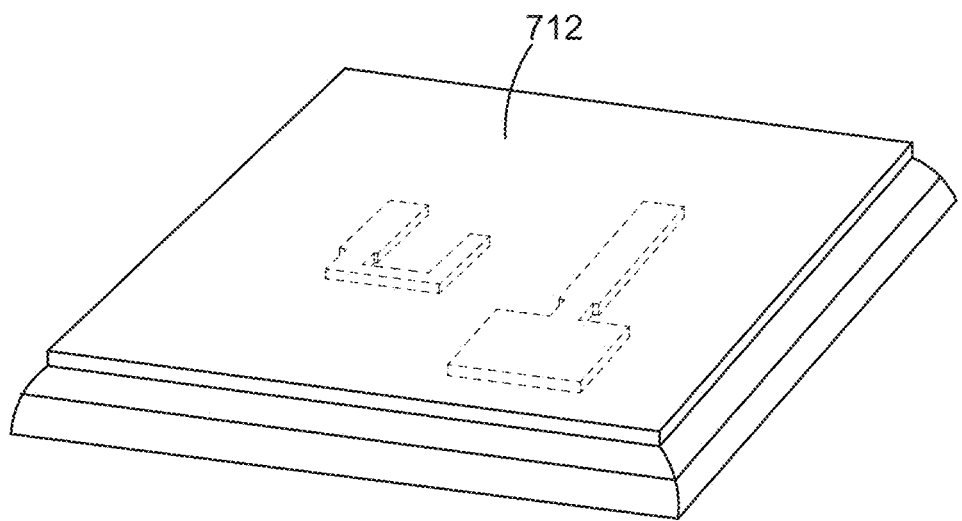
Figure 7F:
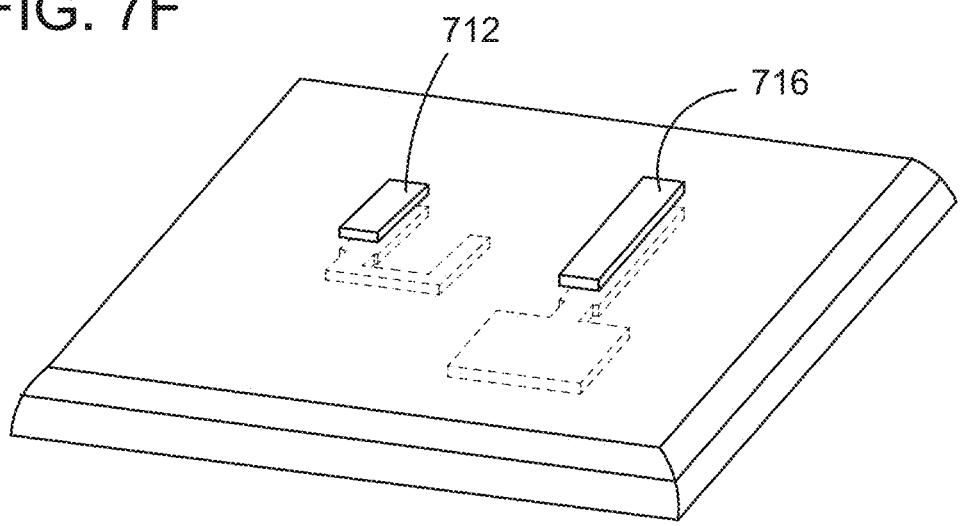
Figure 7G:
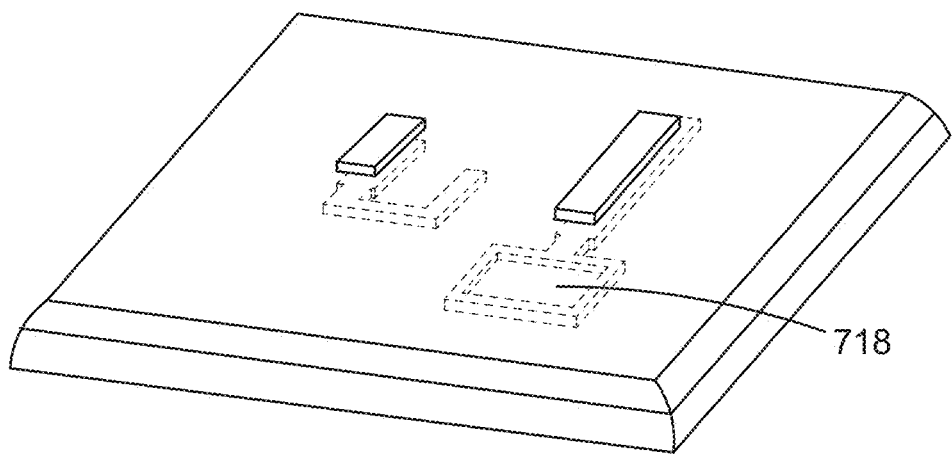
Figure 7H:
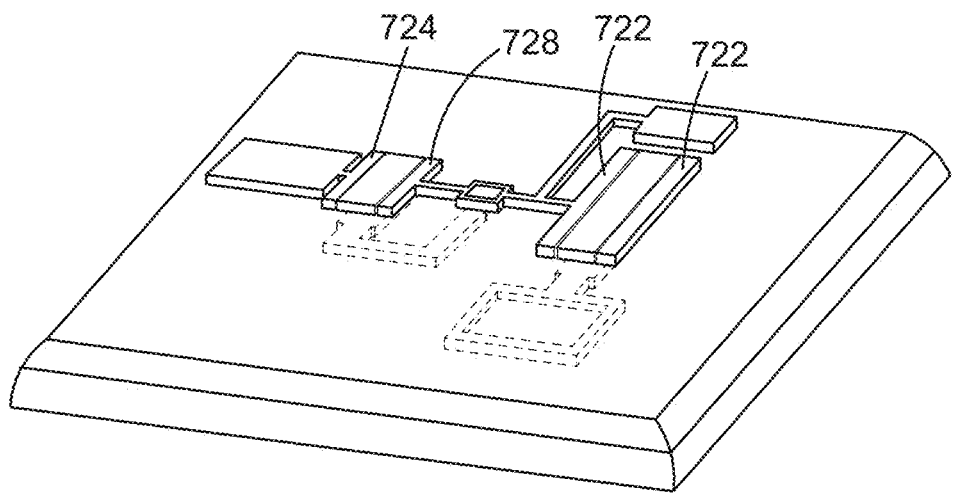

FIGS. 7A-7H are perspective views of the production of the electronic device 600 of FIG. 6 according to an embodiment. Initially, a substrate 702 is provided (FIG. 7A) on which a conducting (metallic) gate layer 704 is formed (FIG. 7B). The gate layer 704 is patterned using, for example photolithography, into two separate gates 706 and 708, one gate for each transistor (FIG. 7C). An insulating dielectric layer 710 is then formed over the two gates 706 and 708 (FIG. 7D). A semiconducting channel layer 712 is formed on the dielectric layer 710 (FIG. 7E), and then the channel layer 712 is patterned, for example using photolithography, into two separate channels 714 and 716, one for each transistor (FIG. 7F). Next, etching is performed to form a via 718 in the dielectric layer 710 to allow connection between the gate of the load transistor with the drain of the drive transistor (FIG. 7G). Finally, the metallic source contact 720 and metallic drain contact 722 of the drive transistor, the metallic source contact 724 and the metallic drain contact 728 of the load transistor, as well as the via contacts, are formed on the dielectric layer 710 (FIG. 7H).

In the NMOS inverter illustrated in FIGS. 6 and 7A-7H, the drive transistor has a channel length of 250 μm and a channel width of 25 μm, and the load transistor has a channel length of 125 μm and a channel width of 25 μm, resulting in a load ratio of 2.5. For both the load and drive transistor, the overlap between the gate and source/drain is 5 μm; however other overlap sizes can be employed. Testing of the disclosed NMOS inverter showed excellent logic change performance. Specifically, the static voltage transfer curves (VTCs) were measured for supply voltage $V_{DD}$ values between 2.5 and 25.0 V at room temperature by sweeping the input voltage (Vinput) from −5 to 5 V, which showed the voltage transfer curves exhibited an excellent rectangular shape with a logic change at approximately $V_{in}$=−0.625 V. The voltage gain for supply voltage $V_{DD}$ values between 2.5 and 25.0 V was approximately 410 (the voltage gain value for a supply voltage $V_{DD}$ value of 25.0 V was approximately 470), and the maximum gain values corresponding to supply voltage $V_{DD}$ values between 2.5 and 25.0 V showed an almost linear behavior.

Although FIGS. 4A-7H illustrate a bottom gate transistor, the invention can equally apply to a top gate transistor in which the source and drain contacts 410A and 410B and the channel 408 are arranged on the substrate, the dielectric layer 406 is arranged on top of the source and drain contacts 410A and 410B and the channel 408, and the gate 404 is arranged on top of the dielectric layer 406. In this case, the channel 408 is interposed between the layers comprising the source and drain contacts 410A and 410B.

Although exemplary embodiments have been described above in connection with particular electronic devices, such as a diode, capacitor, and transistor, it should be recognized that the disclosed methods can be employed to produce a wide variety of electronic devices, including resistors, transistors, inventers, ring oscillators, as well as resistive memories and ferroelectric memories in a HZO-HZO-HZO configuration, which includes three layers—a first metallic HZO layer; a zinc-doped hafnium oxide layer; and a ferroelectric second metallic HZO layer.

The disclosed electronic devices with all of the electrically active portions made from a mixture of hafnium oxide and zinc oxide layers (i.e., an HZO material having different compositions of these layers) are substantially transparent, which provides a large range of applications for such electronic devices, including displays, smart windows, transparent electronics and sensors. Further, the ability to produce such a device in a single reaction chamber using the same deposition process significantly simplifies the production of such devices, as well as the associated cost of production.

The disclosed embodiments provide methods of producing electronic devices using a single material. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A semiconductor device, comprising:
 a substrate;
 a gate arranged on the substrate;
 a dielectric arranged on the gate;
 a channel arranged on the dielectric;
 a source electrically coupled to the channel; and
 a drain electrically coupled to the channel,
 wherein each of the gate, dielectric, channel, source, and drain comprises a corresponding mixture of hafnium dioxide ($HfO_2$) and zinc oxide (ZnO) layers and at least two of the gate, dielectric, channel, source, and drain comprise different mixtures of the hafnium dioxide and zinc oxide layers.

2. The semiconductor device of claim 1, wherein the dielectric, gate, source, and drain each comprise a layer of zinc oxide on top of a plurality of layers of hafnium dioxide.

3. The semiconductor device of claim 2, wherein the dielectric includes fewer layers of hafnium dioxide than the gate, source, and drain.

4. The semiconductor device of claim 1, wherein the channel comprises a plurality of layers of hafnium dioxide on top of a plurality of layers of zinc oxide.

5. The semiconductor device of claim 1, wherein
the gate, source, and drain each comprise a first set of layers of zinc oxide and hafnium dioxide;
the dielectric comprises a second set of layers of zinc oxide and hafnium dioxide,
the channel comprises a third set of layers of hafnium dioxide and zinc oxide,
the first and second set of layers include more layers of hafnium dioxide than zinc oxide, and
the third set of layers include more layers of zinc oxide than hafnium oxide.

6. The semiconductor device of claim 1, wherein the electronic device is substantially transparent.

7. The semiconductor device of claim 1, wherein the gate, dielectric, channel, source, and drain form a first transistor, the semiconductor device further comprising:
a second transistor formed on the substrate, wherein the second transistor comprises a gate, dielectric, channel, source, and drain comprised of compounded layers of hafnium dioxide and zinc oxide.

8. The semiconductor device of claim 7, wherein the first and second transistors are coupled to each other to form an inverter.

9. A method for producing a semiconductor device, the method comprising:
forming a gate on a substrate;
forming a dielectric on the gate;
forming a channel on the dielectric; and
forming a source and drain on the dielectric, wherein the source and drain are electrically coupled to the channel,
wherein each of the gate, dielectric, channel, source, and drain are formed of a corresponding mixture of hafnium dioxide ($HfO_2$) and zinc oxide (ZnO) layers and at least two of the gate, dielectric, channel, source, and drain are formed using different mixtures of the hafnium dioxide and zinc oxide layers.

10. The method of claim 9, wherein each forming step is performed using atomic layer deposition (ALD) in a same reaction chamber.

11. The method of claim 9, wherein each forming step involves forming at least one layer of one of hafnium dioxide and forming at least one layer of zinc oxide.

12. The method of claim 11, wherein the dielectric, gate, source, and drain are formed by depositing a layer of zinc oxide on top of a plurality of layers of hafnium dioxide.

13. The method of claim 12, wherein the dielectric includes fewer layers of hafnium dioxide than the gate, source, and drain.

14. The method of claim 11, wherein the channel is formed by depositing a plurality of layers of hafnium dioxide on top of a plurality of layers of zinc oxide.

15. The method of claim 11, wherein the hafnium dioxide is formed from a tetrakis (dimethylamido) hafnium (IV) precursor and the zinc oxide is formed from a diethyl zinc precursor.

16. An electronic device, comprising:
a first electrical compounded layer comprising a first set of layers of hafnium dioxide ($HfO_2$) and zinc oxide (ZnO) layers; and
a second electrical compounded layer coupled to the first electrical compounded layer and comprising a second set of layers of hafnium dioxide and zinc oxide,
wherein a number of layers of hafnium oxide and zinc oxide is different for the first and second set of layers.

17. The electronic device of claim 16, further comprising:
a third electrical compounded layer coupled to the first electrical compounded layer, wherein the first electrical compounded layer is a dielectric layer arranged between the second and third electrical compounded layers and the electronic device is a capacitor.

18. The electronic device of claim 16, wherein the first and second electrical compounded layers are semiconductor layers and the electronic device is a diode.

19. The electronic device of claim 16, wherein the first electrical compounded layer is a gate layer and the second electrical compounded layer is a dielectric layer arranged on top of the gate layer, the electronic device further comprising:
a channel layer comprising a third set of layers of hafnium oxide and zinc oxide and arranged on top of the dielectric layer;
source and drain layers comprising a fourth set of layers of hafnium oxide and zinc oxide and arranged on top of the channel layer.

20. The electronic device of claim 16, wherein the first electrical compounded layer comprises source and drain layers and the second electrical compounded layer is a channel layer arranged between the source and drain layers, the electronic device further comprising:
a dielectric layer comprising a third set of layers of hafnium oxide and zinc oxide and arranged on top of the source, drain, and channel layers;
a gate layer comprising a fourth set of layers of hafnium oxide and zinc oxide and arranged on top of the dielectric layer.

* * * * *